United States Patent
Mankos et al.

(10) Patent No.: US 7,838,832 B1
(45) Date of Patent: Nov. 23, 2010

(54) ELECTRON BEAM APPARATUS AND INSPECTION METHOD USING DUAL ILLUMINATION BEAMS WITH DYNAMICALLY CONTROLLABLE OFFSETS

(75) Inventors: Marian Mankos, Palo Alto, CA (US); Vassil Spasov, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 420 days.

(21) Appl. No.: 12/135,058

(22) Filed: Jun. 6, 2008

(51) Int. Cl.
*H01J 37/26* (2006.01)
*G01N 23/225* (2006.01)
(52) U.S. Cl. .......................... 250/310; 250/307
(58) Field of Classification Search .............. 250/310, 250/307
See application file for complete search history.

(56) References Cited

U.S. PATENT DOCUMENTS

| | | | |
|---|---|---|---|
| 4,564,758 A | 1/1986 | Slodzian et al. | |
| 5,444,242 A | 8/1995 | Larson et al. | |
| 5,973,323 A * | 10/1999 | Adler et al. | 250/310 |
| 6,586,733 B1 | 7/2003 | Veneklasen et al. | |
| 6,610,980 B2 | 8/2003 | Veneklasen et al. | |
| 6,803,571 B1 | 10/2004 | Mankos et al. | |
| 6,930,309 B1 | 8/2005 | Mankos et al. | |
| 7,205,542 B1 * | 4/2007 | Mankos et al. | 250/310 |
| 7,217,924 B1 | 5/2007 | Mankos et al. | |
| 2002/0070340 A1 | 6/2002 | Veneklasen et al. | |

FOREIGN PATENT DOCUMENTS

WO   WO 01/88514 A1   11/2001

OTHER PUBLICATIONS

Veneklasen, et al., "The Continuing Development of the Low-Energy Electron Microscope for Characterizing Surface", Dec. 1992, pp. 5513-5532 vol. 63, No. 12, Rev. Sci. Institute of Physics.
Chmelik, et al., "Comparing Cathode Lens Configurations for Low Energy Electron Microscopy", 1989, pp. 155-160, vol. 83, No. 5, OPTIK.

* cited by examiner

*Primary Examiner*—Jack I Berman
(74) *Attorney, Agent, or Firm*—Okamoto & Benedicto LLP (57) ABSTRACT

An apparatus for generating a dual-energy electron beam. The apparatus includes a first electron beam source configured to generate a lower-energy electron beam, and a second electron beam source configured to generate a higher-energy electron beam. The apparatus further includes a combining device for forming the dual-energy electron beam by combining the lower-energy and higher-energy electron beams. In addition, a first controllable electron-beam deflector is configured to provide a controllable offset of a first area illuminated by the lower-energy electron beam in relation to an image data collection area, and a second controllable electron-beam deflector configured to provide a controllable offset of a second area illuminated by the higher-energy electron beam in relation to the image data collection area. A moving stage and a time delay integration detection system are utilized. Other embodiments, aspects and features are also disclosed.

20 Claims, 11 Drawing Sheets

ELECTRON BEAM APPARATUS AND INSPECTION METHOD USING DUAL ILLUMINATION BEAMS WITH DYNAMICALLY CONTROLLABLE OFFSETS

GOVERNMENT LICENSE RIGHTS

The U.S. Government has a paid-up license in this invention and the right in limited circumstances to require the patent owner to license others on reasonable terms as provided for by the terms of Contract No. DAAD19-00-3-1001 awarded by the Defense Advanced Research Projects Agency.

BACKGROUND OF THE INVENTION

1. Field of the Invention

The present invention relates generally to electron beam (e-beam) apparatus and e-beam inspection methods.

2. Description of the Background Art

Most conventional wafer and mask inspection systems use light optical images. Scanning electron beam microscopes (SEMs) have also been developed for inspection and critical dimension (CD) measurement. These SEM instruments scan a very small beam over the surface, and record the re-emitted secondary electrons in a single detector. Image acquisition tends to be slower for SEMs than for direct imaging light optical instruments because only one image element (pixel) at a time is recorded.

A low energy emission microscope (LEEM) is a direct imaging (as opposed to scanning) electron microscope. A conventional LEEM uses a single illumination beam which is accelerated typically to about 10 to 30 keV (kilo electron-volts) in an electron gun. The single beam passes through a separator magnet that bends the beam into the axis of the objective lens. An image of the gun crossover is transferred to the back focal (diffraction) plane of the objective lens, forming a parallel flood beam that uniformly illuminates the substrate. The substrate is electrically floated at approximately the same voltage as the cathode of the electron gun, so that illuminating electrons are decelerated in the objective lens, striking the substrate at energies typically between 0 to about 1,000 eV (electron-volts). Some examples of prior art LEEM systems are described in the review paper: "The continuing development of the low energy electron microscope for characterizing surfaces," L. Veneklasen, Rev. Sci. Inst. 63(12) p. 5513 (December 1992) and its references.

Insulating surfaces are generally not a problem for light optical inspection because the scattering and reflection of light is insensitive to electrostatic surface charge. Unfortunately, surface charging effects can pose a difficulty for electron beam imaging of insulating surfaces (whether scanned or direct imaging). The rate that a given pixel element charges depends upon the difference between electron flux arriving at and leaving each pixel. The high current densities required for imaging at inspection rates imply a likely high rate of charging if the electron flux leaving the surface is not balanced by that entering. Thus, the surface voltage can quickly reach levels detrimental to imaging or even, in some instances, detrimental to sample integrity. Effective means for controlling local surface charging are therefore desirable if e-beam instruments are to be used for inspection of wafers, masks and other non-conductive substrates.

SUMMARY

One embodiment pertains to an apparatus for generating a dual-energy electron beam. The apparatus includes a first electron beam source configured to generate a lower-energy electron beam, and a second electron beam source configured to generate a higher-energy electron beam. The apparatus further includes a combining device for forming the dual-energy electron beam by combining the lower-energy and higher-energy electron beams. In addition, a first controllable electron-beam deflector is configured to provide a controllable offset of a first area illuminated by the lower-energy electron beam in relation to an image data collection area, and a second controllable electron-beam deflector configured to provide a controllable offset of a second area illuminated by the higher-energy electron beam in relation to the image data collection area. A moving stage and a time delay integration detection system are utilized.

Other embodiments, aspects and features are also disclosed.

DETAILED DESCRIPTION

Figure 1:
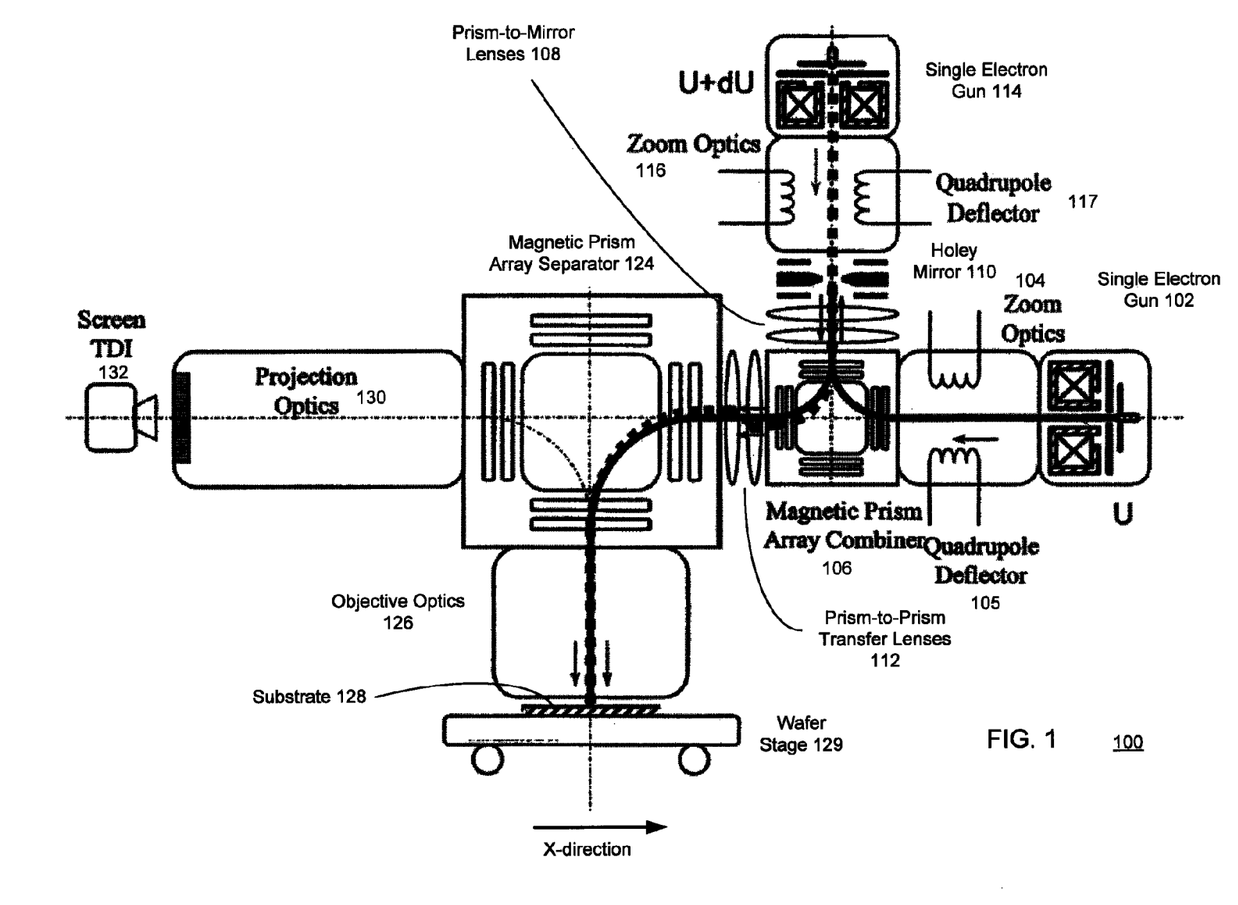
FIG. 1 is a schematic diagram depicting an electron beam apparatus having dual illumination beams with dynamic offsets in accordance with an embodiment of the invention.

FIG. 1 is a schematic diagram depicting an electron beam apparatus 100 having dual illumination beams with dynamic offsets in accordance with an embodiment of the invention. Such an apparatus 100 may be used to improve performance and capabilities of electron beam inspection systems with parallel imaging of insulating and semiconductor substrates using a magnetic immersion objective lens.

As shown in FIG. 1, the apparatus 100 includes four portions or sections: an illumination arrangement; an objective lens arrangement; a projection arrangement; and a beam separator. Compared with previous apparatus, the apparatus 100 of FIG. 1 includes a substantially modified illumination arrangement.

The illumination arrangement of FIG. 1 includes two perpendicular branches which are connected by a magnetic prism array combiner 106. The first branch includes a first electron gun or source 102 at a first (lower) potential energy U, along with a first zoom electron-optics 104.

The second branch includes a second electron gun or source 114 at a second (higher) potential energy U+dU, along with second zoom electron-optics 116. The second branch also includes a prism-to-mirror lens configuration 108, and a semitransparent holey mirror arrangement 110. The holey mirror arrangement 110 is similar to the arrangement disclosed in U.S. Pat. No. 7,217,924, entitled "Holey Mirror Arrangement for Dual-Energy E-Beam Inspector," issued May 15, 2007 to Marian Mankos and Eric Munro, the disclosure of which is hereby incorporated by reference.

The magnetic prism array combiner 106 may be implemented as a compact, double focusing magnetic prism array which forms uniform magnetic fields of different strength and length. For example, see U.S. Pat. No. 6,878,937, "Prism Array for Electron Beam Inspection and Defect Review," issued Apr. 12, 2005 to Marian Mankos, the disclosure of which is hereby incorporated by reference. The magnetic prism array combiner 106 is configured so as to make co-axial the two electron beams emitted from the two spatially separated beam guns (102 and 114).

The first electron gun 102 is biased at a high negative potential of $V_1 = -V_0$ so as to generate a first electron beam (solid line in FIG. 1) of relatively lower energy. As shown in FIG. 1, the first gun 102 may be located along the horizontal microscope axis formed by the illumination and projection optics. After the illumination zoom optics 104, the lower-energy beam passes through the magnetic prism array combiner, which deflects this beam by ninety degrees (or approximately ninety degrees) into the prism-to-mirror lenses 108 which focus the beam onto the holey mirror arrangement 110.

The holey mirror 110 may be implemented as an electrostatic lens or mirror which is biased slightly more negatively than the first gun 102. For example, the holey mirror 110 may be biased to be at $V_{mirror} = -V_0 - dV$. Because of the more negative bias of the holey mirror 110 relative to the bias of the first gun 102, the holey mirror 110 reflects or repels the first electron beam back through the prism-to-mirror lenses 108, so that the first electron beam returns into the magnetic prism array combiner 106.

In addition, the second electron gun 114, positioned along the vertical axis of the prism array combiner 106, is biased more negatively than the holey mirror 110 so as to generate a second electron beam (dashed line in FIG. 1) at relatively higher energy. In other words, the second electron gun 114 may be biased at a high negative voltage of $V_2 = -V_0 - \Delta V$, where $\Delta V$ is larger than dV. For example, $\Delta V$ may be a few hundred volts. Since the second electron gun 114 is biased more negatively than the holey mirror 110, the second electron beam, after the zoom optics 116, passes through the hole or opening of the holey mirror 110 and becomes co-axial with the first, lower energy beam. The second beam is injected into the magnetic prism array combiner 106 in a co-axial manner with respect to the first beam.

Moreover, in accordance with an embodiment of the invention, a first quadrupole deflector 105 may be advantageously configured to provide an electronically controllable magnetic field so as to variably and dynamically deflect the electron beam within the first zoom electron-optics 104. This first deflector 105 enables the apparatus to controllably and dynamically offset the first (lower-energy) electron beam (solid line in FIG. 1), as discussed below in relation to FIGS. 2A through 7B, for example.

Furthermore, in accordance with an embodiment of the invention, a second quadrupole deflector 117 may be advantageously configured to provide an electronically controllable magnetic field so as to variably and dynamically deflect the electron beam within the second zoom electron-optics 116. This second deflector 117 enables the apparatus to controllably and dynamically offset the second (higher-energy) electron beam (dashed line in FIG. 1), as discussed below in relation to FIGS. 2A through 7B, for example.

The magnetic prism array combiner 106 deflects both the first and second electron beams by approximately ninety degrees so that their trajectories are back approximately along the horizontal microscope axis. However, because the second electron beam has a relatively higher energy and hence a relatively higher velocity than the first electron beam, the second electron beam (dashed line) is deflected less (i.e. is bent less) than the first electron beam (solid line) by the magnetic prism array combiner 106. For example, as shown in FIG. 1, the first beam (solid line, lower energy) may be deflected by 90 degrees to be parallel with the horizontal microscope axis while the second beam (dashed line, higher energy) may be deflected by slightly less than 90 degrees to be almost (but not quite) parallel to the horizontal microscope axis.

The prism-to-prism transfer lenses 112 are configured to change the trajectory of one or both electron beams before the beams enter the magnetic prism array separator (beam separator) 124. For example, as shown in FIG. 1, the trajectory of the second electron beam (dashed line, higher energy) may be changed so that the second electron beam enters the beam separator 124 at an inclined angle relative to the horizontal microscope axis.

The beam separator 124 may comprise, for example, a compact, double focusing magnetic prism array which provides uniform magnetic fields of different strength and length so as to provide a mechanism for stigmatic focusing and also enables the prism array to behave as a round lens. The round lens type behavior greatly simplifies set-up, alignment and operation of the apparatus. The beam separator 124 may be configured to deflect the first and second electron beams such that they are co-axial after they emerge from the beam separator 124 (as they enter the objective optics 126). For example, as shown in FIG. 1, the first beam (solid line, lower energy) may be deflected by 90 degrees, and the second beam (dashed line, higher energy) may be deflected by slightly less than 90 degrees such that both beams end up with trajectories that are parallel with the vertical axis of the beam separator 124.

In a preferred embodiment, the prism array combiner 106 and the prism array separator 124 have identical or near identical dispersions. In addition, the prism-to-prism transfer lenses 112 preferably operates as a unity magnification transfer lens.

The angular difference in the trajectories of the first and second beams going into the array separator 124 may be configured such that both beams exit the array separator 124 (and enter the objective optics 126) at a same (co-axial) trajectory. After the beam is deflected into the objective optics 126, the electrons are decelerated and focused by the objective lens. The electrons are scattered by an illuminated surface region of the substrate 128, thus forming a two-dimensional electron "image." This image from the scattered electrons is then refocused by the objective lens and deflected by the beam separator 128 into the projection optics 130, which magnifies the image for detection and display on a viewing screen.

In accordance with an embodiment of the invention, the detection is performed by a time delay integration (TDI) detection system 132. In a TDI detection system, accumulated charges corresponding to image pixels are typically moved from one row to the next in discrete increments. The timing of the movement of accumulated charges is synchronized to the linear motion of the substrate under inspection. As such, an electron image of an area may be obtained even while the target substrate is moving underneath the electron beam column. In other words, the TDI detection system 132 compensates for the movement of the target substrate while image data is being obtained such that the substrate movement does not induce blurring in the image data.

The wafer stage 129 may be configured to translate the substrate 128 relative to the objective optics 126. For example, the wafer stage 129 may provide a linear translational motion in the "x-direction" of the substrate 128 relative to the objective optics 126.

Figure 2A:
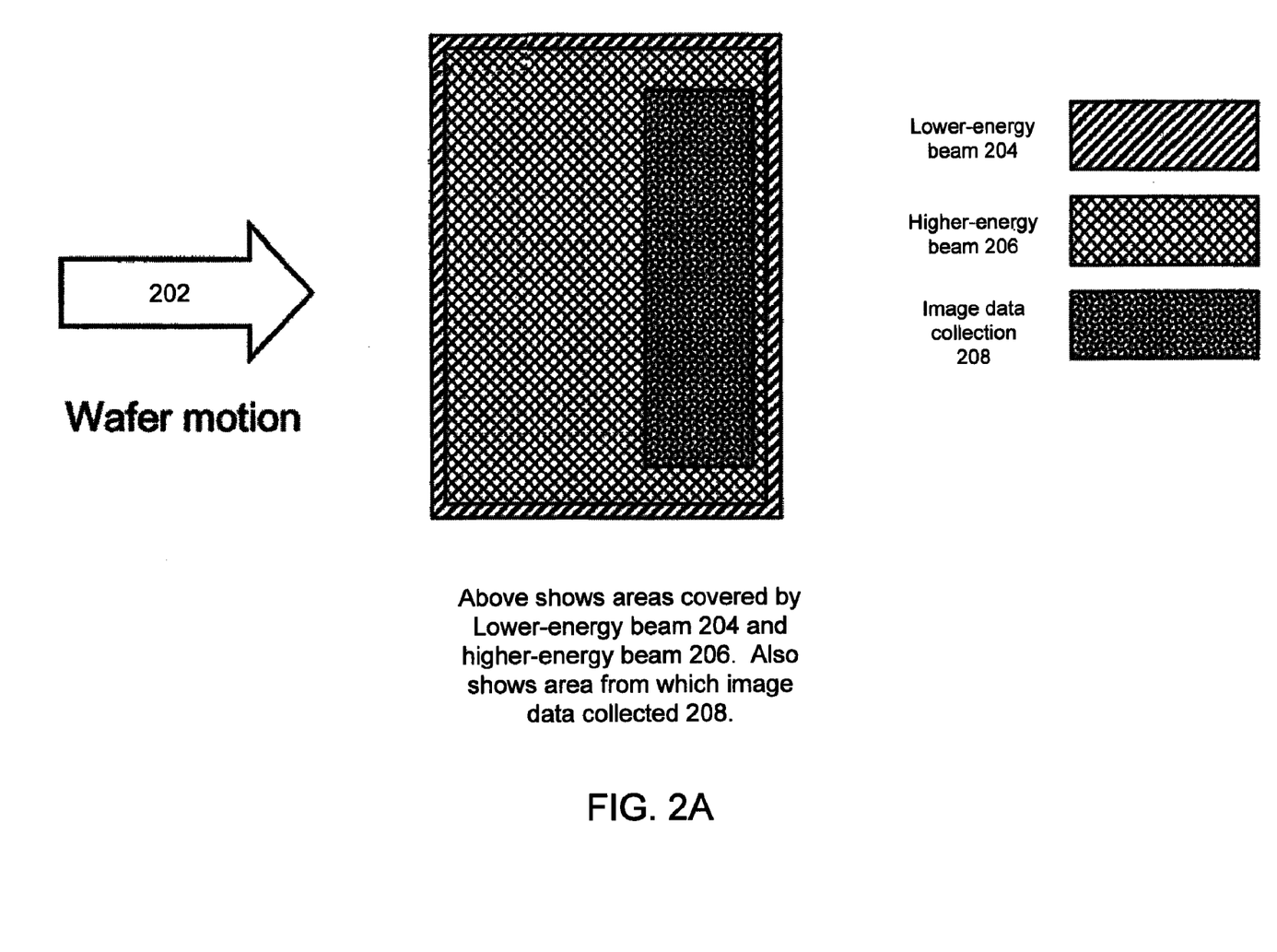
FIG. 2A is a schematic diagram showing a first arrangement of the dual illumination beams and the image data collection in accordance with an embodiment of the invention.

FIG. 2A is a schematic diagram showing a first arrangement of the dual illumination beams and the image data collection in accordance with an embodiment of the invention. In FIG. 2A, the direction of motion 202 of the target wafer (or other substrate) is shown. This direction of motion 202 may correspond to the x-direction shown in FIG. 1. The substrate preferably moves linearly in this direction due to movement of a wafer stage.

Figure 2B:
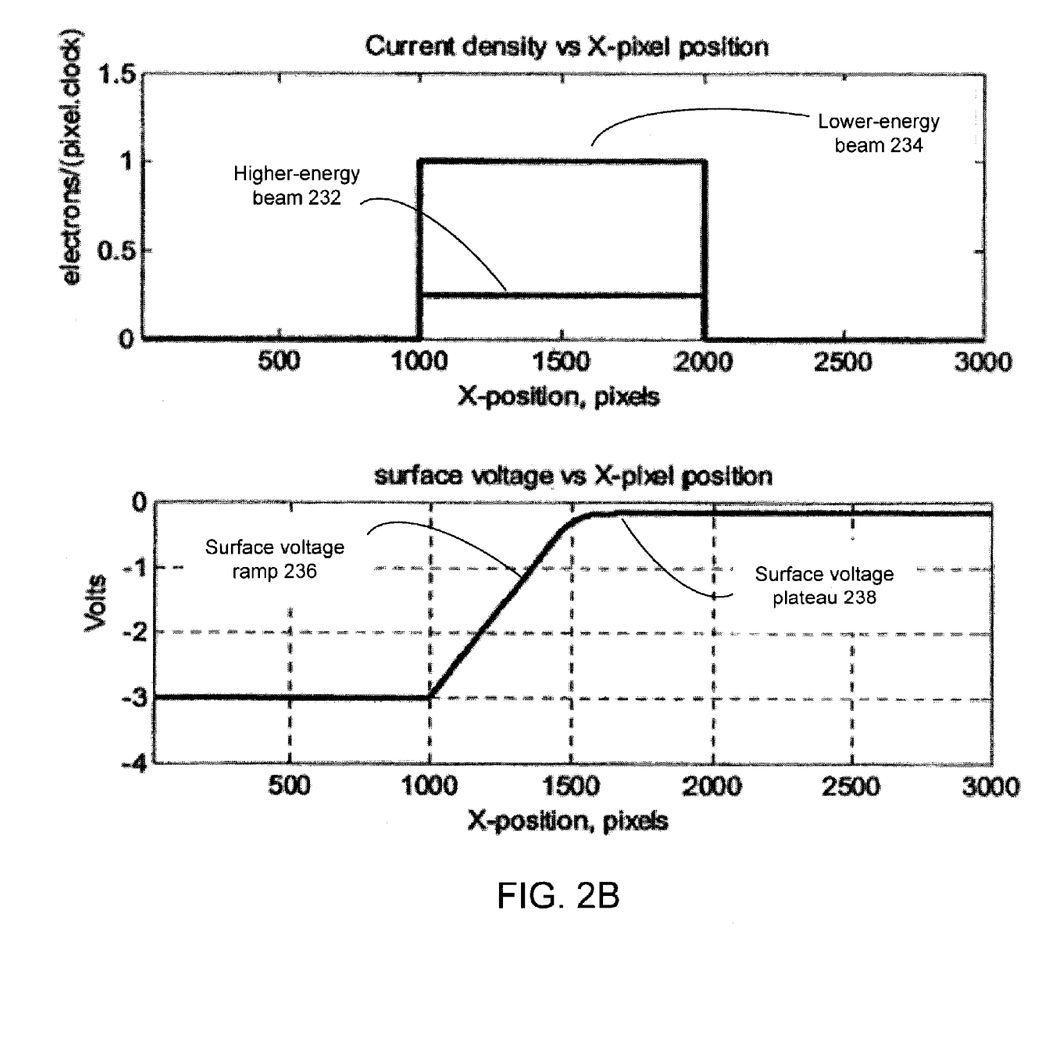
FIG. 2B shows graphs of beam current densities and surface voltage for the first arrangement in accordance with an embodiment of the invention.

FIG. 2B shows example graphs of beam current densities and surface voltage for the first arrangement in accordance with an embodiment of the invention. In the top portion of FIG. 2B, plots of electron current density versus x-pixel position are shown for the higher-energy beam (see plot 232) and for the lower-energy beam (see plot 234). As shown by the height of the plots, the higher-energy beam may have a lower current density than the lower-energy beam. In particular, the higher-energy beam 232 is shown to have approximately one-fourth the current density as the lower-energy beam 234. In the bottom portion of FIG. 2B, an example plot of surface voltage versus x-pixel position is shown.

In this first arrangement, the first deflector 105 is configured such that the lower-energy beam "illuminates" or covers a first rectangular area 204 whose boundaries are shown in FIG. 2A. (The interior of the first rectangular area is overlapped by the other patterned areas in the figure.) The second deflector 117 is configured such that the higher-energy beam "illuminates" or covers a second rectangular area 206 shown in FIG. 2A. (Part of the second rectangular area is overlapped by the image data collection area 208 in the figure.)

As seen in FIG. 2A, the areas illuminated by the lower-energy (204) and higher-energy (206) beams are largely coincident and substantially overlap in this arrangement. In other words, the two beams are co-axial and of approximately a same size in this arrangement.

However, the image data collection area 208 (the area from which the scattered electrons are imaged) is not coincident with the areas illuminated by the two beams (204 and 206). Instead, in accordance with this arrangement, the image data collection area 208 is shifted or offset to one side of the areas illuminated by the two beams (204 and 206). In particular, the image data collection area 208 is shifted or offset in the same direction as the direction 202 of the substrate motion.

With this arrangement, a region of the target substrate to be imaged (i.e. a target region) is first moved under the areas illuminated by the two beams (204 and 206). As shown in FIG. 2B, the illumination by the two beams (204 and 206) may be configured so as to increase or ramp up 236 the surface voltage of a target region of an insulating or semiconductor substrate. As further shown in FIG. 2B, a surface voltage plateau 238 may be reached while target region is still under illumination by the two beams (204 and 206).

After further translation of the substrate, the target region may be moved into the area for image data collection 208 while still being within the areas illuminated by the two beams (204 and 206). More particularly, in this case, the target region may be at the surface voltage plateau 238 by the time it reaches image data collection area 208. Hence, this first arrangement provides for surface potential stabilization before the target region is imaged and also pre-charging of the defects of interest.

Figure 3A:
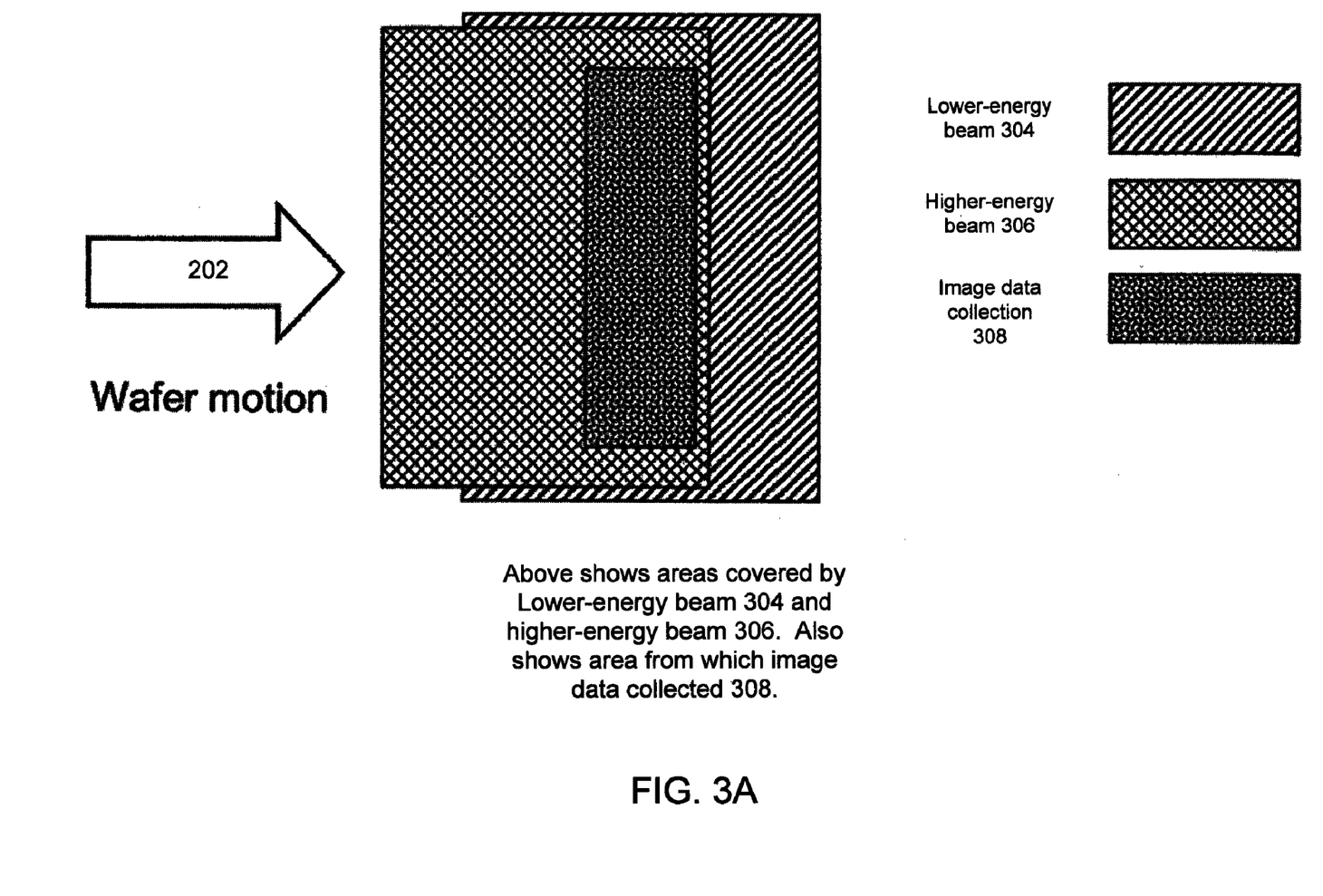
FIG. 3A is a schematic diagram showing a second arrangement of the dual illumination beams and the image data collection in accordance with an embodiment of the invention.

FIG. 3A is a schematic diagram showing a second arrangement of the dual illumination beams and the image data collection in accordance with an embodiment of the invention. The direction of motion 202 of the target wafer (or other substrate) is again shown.

Figure 3B:
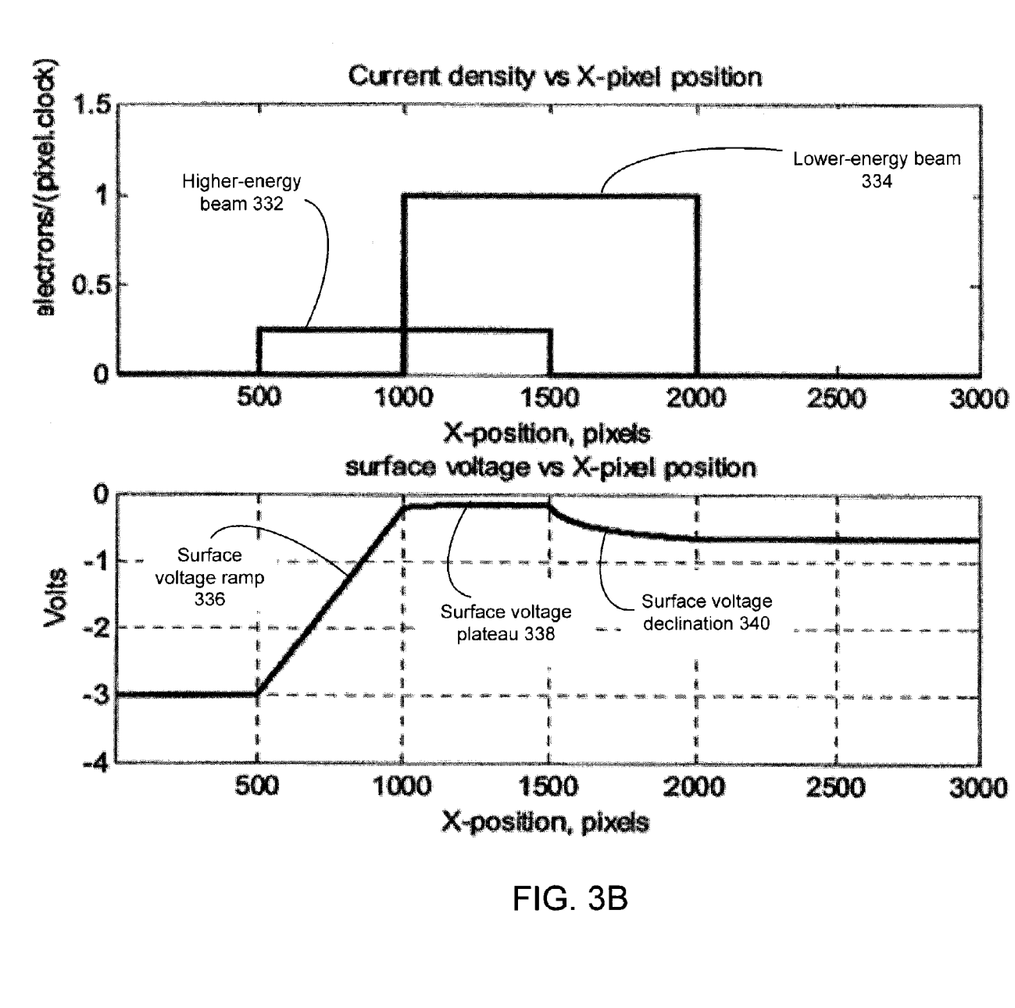
FIG. 3B shows graphs of beam current densities and surface voltage for the second arrangement in accordance with an embodiment of the invention.

FIG. 3B shows example graphs of beam current densities and surface voltage for the second arrangement in accordance with an embodiment of the invention. In the top portion of FIG. 3B, plots of electron current density versus x-pixel position are shown for the higher-energy beam (see plot 332) and for the lower-energy beam (see plot 334). As shown by the height of the plots, the higher-energy beam may have a lower current density than the lower-energy beam. In particular, the higher-energy beam 332 is shown to have approximately one-fourth the current density as the lower-energy beam 334. In the bottom portion of FIG. 3B, an example plot of surface voltage versus x-pixel position is shown.

In this second arrangement, the first deflector 105 is configured such that the lower-energy beam "illuminates" or covers a first rectangular area 304 whose boundaries are shown in FIG. 3A. (Portions of the first rectangular area are overlapped by the other patterned areas in the figure.) The second deflector 117 is configured such that the higher-energy beam "illuminates" or covers a second rectangular area 306 shown in FIG. 3A. (Part of the second rectangular area is overlapped by the image data collection area 308 in the figure.)

As seen in FIG. 3A, although the areas illuminated by the lower-energy and higher-energy beams do overlap, they are not coincident. Instead, the second rectangular area (the higher-energy beam) 306 is shifted or offset in the opposite direction as the direction 202 of the substrate motion. More particularly, a target region to be imaged enters the second rectangular area (the higher-energy beam) 306, then enters the first rectangular area (the lower-energy beam) 304, then exits the second rectangular area (the higher-energy beam) 306, and lastly exits the first rectangular area (the lower-energy beam) 304.

Meanwhile, in accordance with this arrangement, the image data collection area 308 is positioned near a middle of the first rectangular area (the lower-energy beam) 304 and also overlaps a portion of the second rectangular area (the higher-energy beam) 306.

With this arrangement, a region of the target substrate to be imaged (i.e. a target region) is first moved under the areas illuminated the first rectangular area (the higher-energy beam) 306. As shown in FIG. 3B, the illumination by the first rectangular area (the higher-energy beam) 306 may be configured so as to increase or ramp up 336 the surface voltage of a target region of an insulating or semiconductor substrate.

As further shown in FIG. 3B, a surface voltage plateau 338 may be reached when the target region goes into an area covered by both the first rectangular area (the lower-energy beam) 304 and the second rectangular area (the higher-energy beam) 306. The image data collection 308 may also occur during this time of dual beam coverage.

After further translation of the substrate, the target region may be moved out of the first rectangular area (the higher-energy beam) 306 while still being within the second rectangular area (the lower-energy beam) 304. In this case, the target region undergo a surface voltage declination 340. Hence, this arrangement also provides for surface potential stabilization before the target region is imaged and also pre-charging of the defects of interest.

Figure 4A:
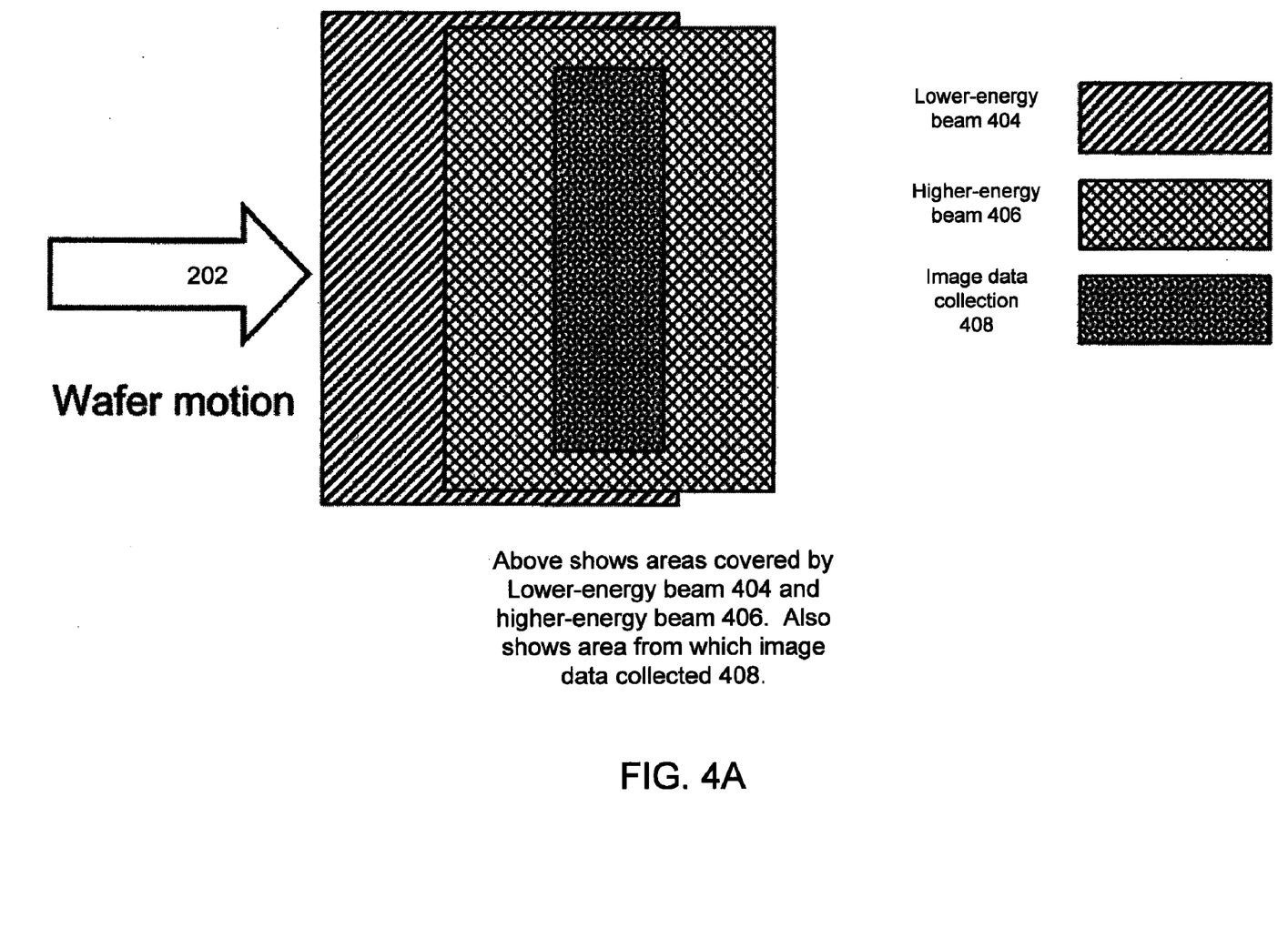
FIG. 4A is a schematic diagram showing a third arrangement of the dual illumination beams and the image data collection in accordance with an embodiment of the invention.

FIG. 4A is a schematic diagram showing a third arrangement of the dual illumination beams and the image data collection in accordance with an embodiment of the invention. The direction of motion 202 of the target wafer (or other substrate) is again shown.

Figure 4B:
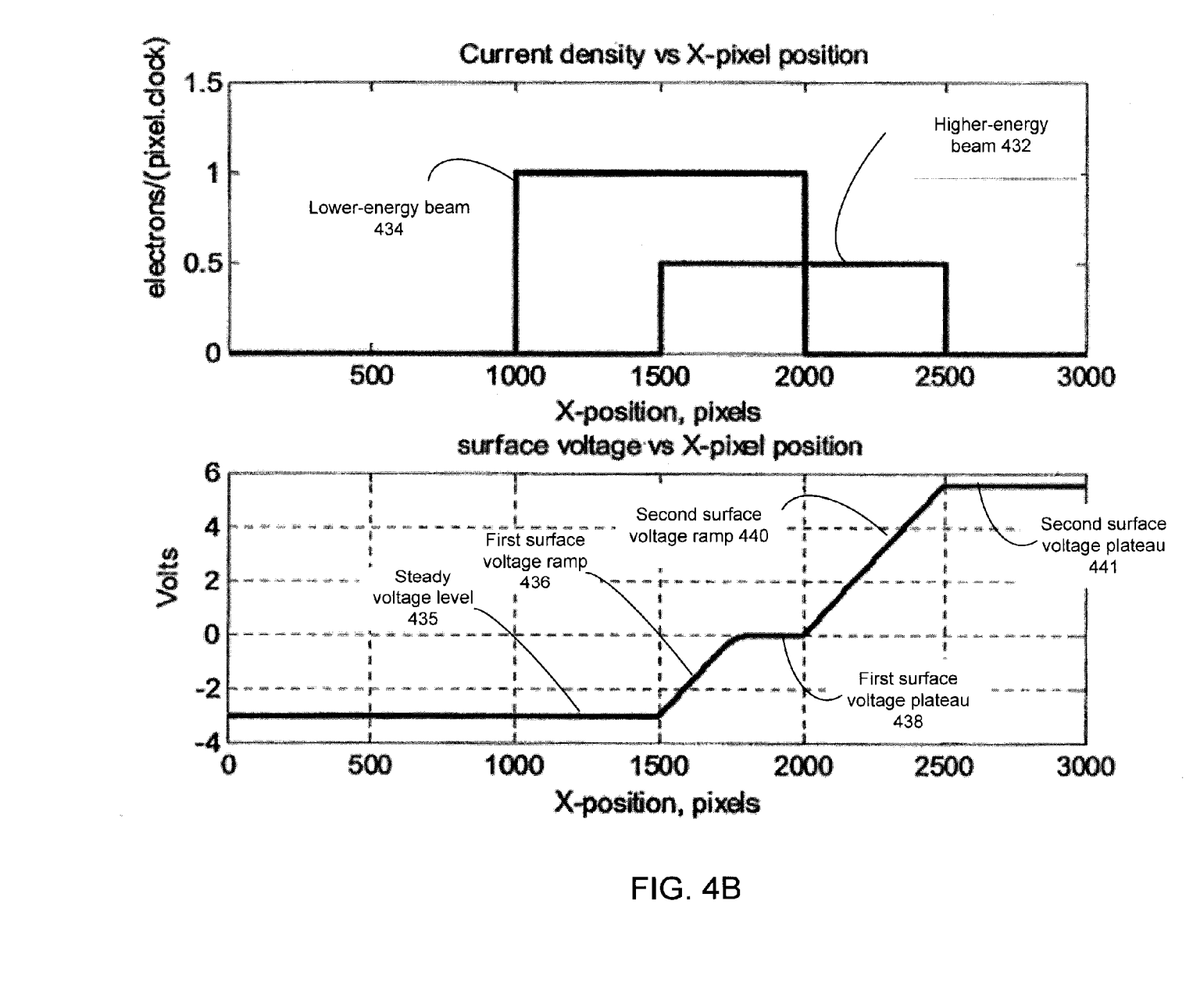
FIG. 4B shows graphs of beam current densities and surface voltage for the third arrangement in accordance with an embodiment of the invention.

FIG. 4B shows example graphs of beam current densities and surface voltage for the third arrangement in accordance with an embodiment of the invention. In the top portion of FIG. 4B, plots of electron current density versus x-pixel position are shown for the higher-energy beam (see plot 432) and for the lower-energy beam (see plot 434). As shown by the height of the plots, the higher-energy beam may have a lower current density than the lower-energy beam. In particular, the higher-energy beam 432 is shown to have approximately one-half the current density as the lower-energy beam 434. In the bottom portion of FIG. 4B, an example plot of surface voltage versus x-pixel position is shown.

In this third arrangement, the first deflector 105 is configured such that the lower-energy beam "illuminates" or covers a first rectangular area 404 whose boundaries are shown in FIG. 4A. (Portions of the first rectangular area are overlapped by the other patterned areas in the figure.) The second deflector 117 is configured such that the higher-energy beam "illuminates" or covers a second rectangular area 406 shown in FIG. 4A. (Part of the second rectangular area is overlapped by the image data collection area 408 in the figure.)

As seen in FIG. 4A, although the areas illuminated by the lower-energy and higher-energy beams do overlap, they are not coincident. Instead, the first rectangular area (the lower-energy beam) 404 is shifted or offset in the opposite direction as the direction 202 of the substrate motion. More particularly, a target region to be imaged enters the first rectangular area (the lower-energy beam) 404, then enters the second rectangular area (the higher-energy beam) 406, then exits the first rectangular area (the lower-energy beam) 404, and lastly exits the second rectangular area (the higher-energy beam) 406.

Meanwhile, in accordance with this arrangement, the image data collection area 408 is positioned near a middle of the second rectangular area (the higher-energy beam) 406 and also overlaps a portion of the first rectangular area (the lower-energy beam) 404.

With this arrangement, a region of the target substrate to be imaged (i.e. a target region) is first moved under the areas illuminated the second rectangular area (the lower-energy beam) 404. As shown in FIG. 4B, the illumination by the second rectangular area (the lower-energy beam) 404 alone may result in a steady surface voltage level 435.

After further translation of the substrate, the target region may be moved into an area of illumination by the two beams (404 and 406) where the surface voltage of the target region increases or ramps up 436. As further shown in FIG. 4B, a first surface voltage plateau 438 may be reached while target region is under illumination by the two beams (404 and 406). The image data collection 408 may also occur during this time of dual beam coverage.

After further translation of the substrate, the target region may be moved out of the first rectangular area (the lower-energy beam) 404 while still being within the second rectangular area (the higher-energy beam) 406. In this case, the target region undergoes a second surface voltage increase or ramp up 440.

Thereafter, the target region may be moved out of the second rectangular area (the higher-energy beam) 406. This may result in a second surface voltage plateau 441. Thus, this arrangement also provides for surface potential stabilization before the target region is imaged (see the first voltage plateau 438) and also pre-charging of the defects of interest.

Figure 5:
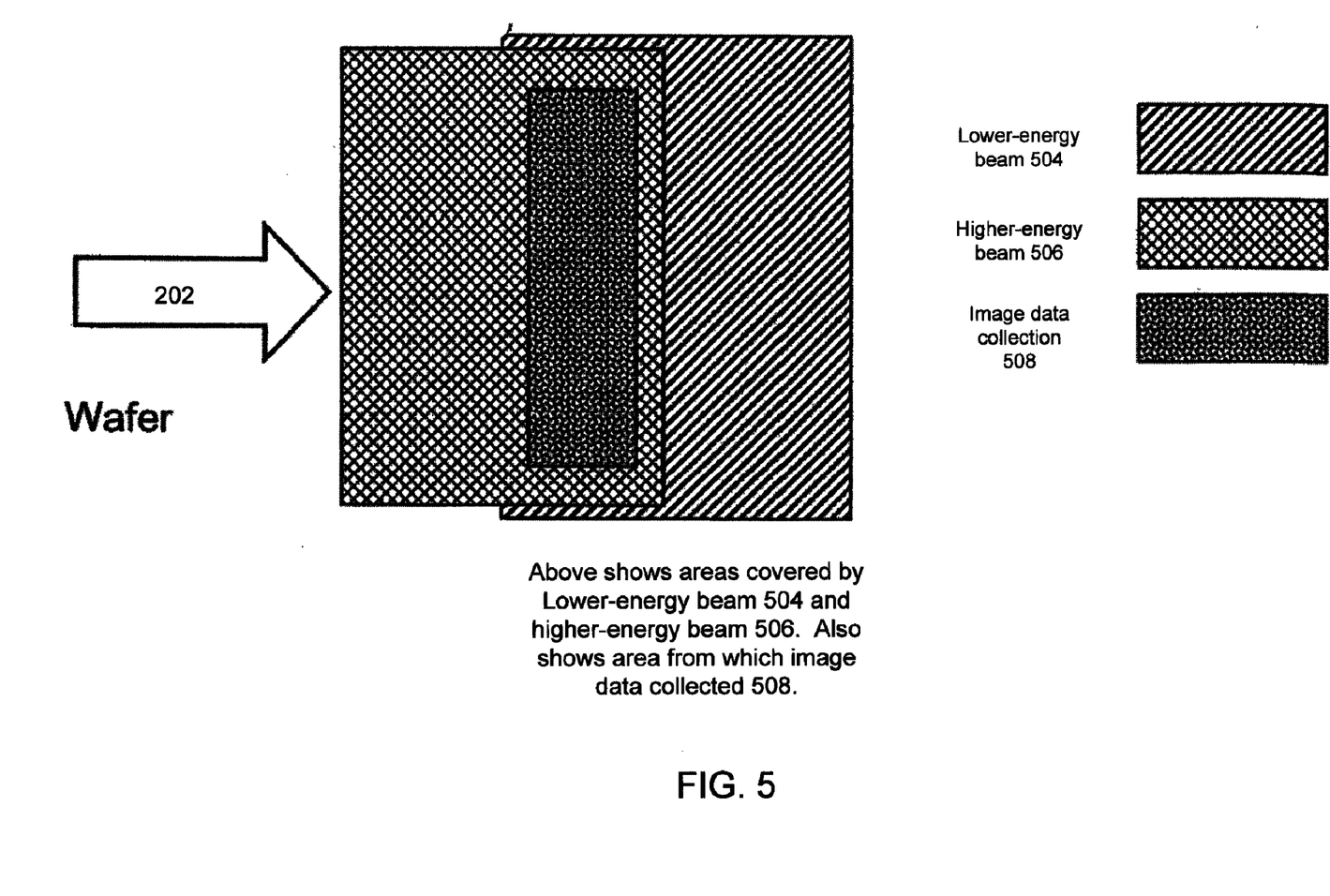
FIG. 5 is a schematic diagram showing a fourth arrangement of the dual illumination beams and the image data collection in accordance with an embodiment of the invention.

FIG. 5 is a schematic diagram showing a fourth arrangement of the dual illumination beams and the image data collection in accordance with an embodiment of the invention. The direction of motion 202 of the target wafer (or other substrate) is again shown.

The fourth arrangement per FIG. 5 is similar to the second arrangement per FIG. 3A. However, the shift or offset between the higher-energy beam area 506 and the lower-energy beam area 504 is greater in the arrangement of FIG. 5 than in the arrangement of FIG. 3A. In addition, the image data collection area 508 is within a more narrowly-defined area of overlap between the higher-energy beam area 506 and the lower-energy beam area 504.

As a result, the corresponding surface voltage ramp should be longer in the fourth arrangement than in the second arrangement (see ramp 336 in FIG. 3B). In addition, the surface voltage declination should be longer in the fourth arrangement than in the second arrangement (see declination 340 in FIG. 3B).

Figure 6:
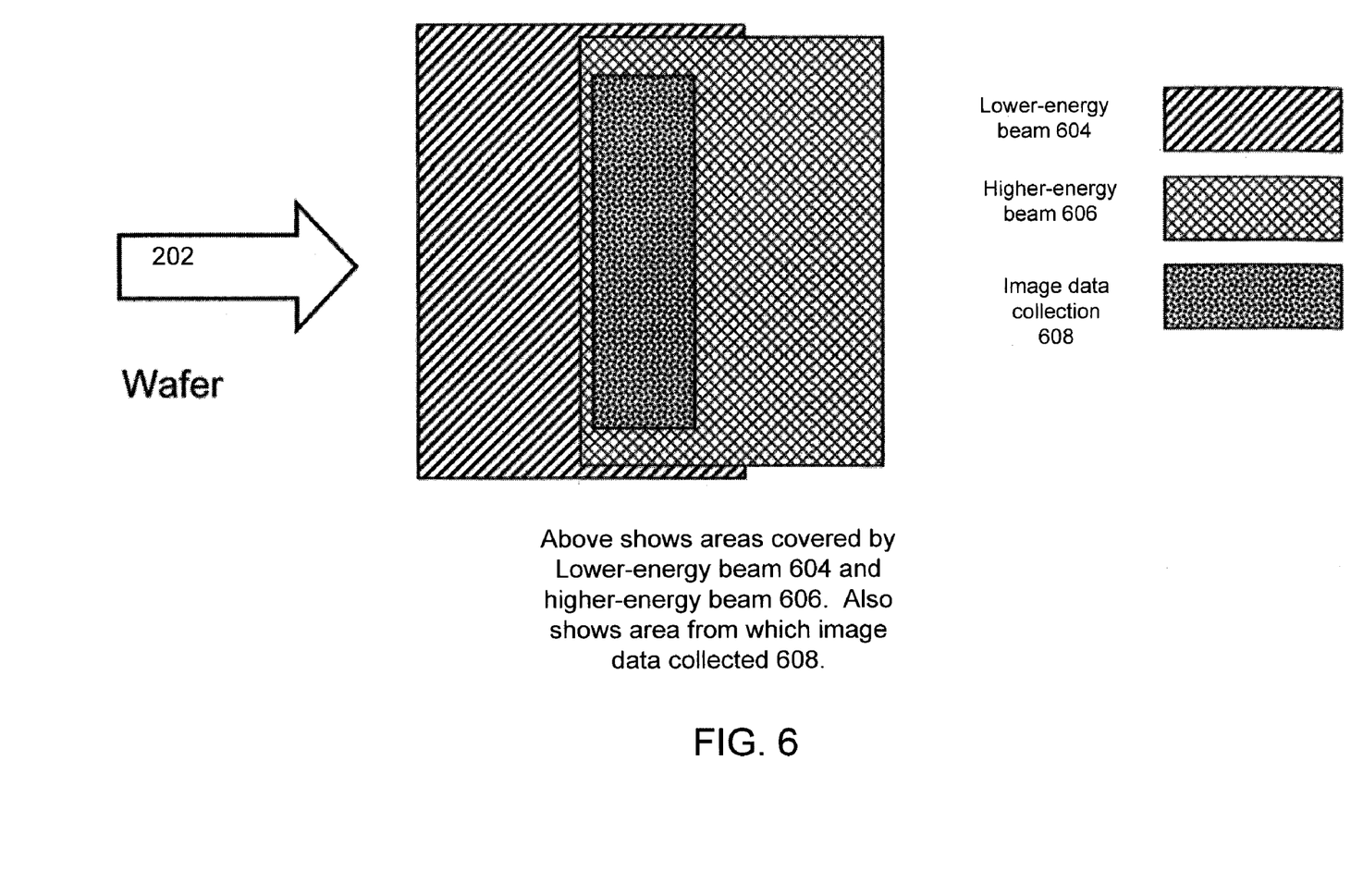
FIG. 6 is a schematic diagram showing a fifth arrangement of the dual illumination beams and the image data collection in accordance with an embodiment of the invention.

FIG. 6 is a schematic diagram showing a fifth arrangement of the dual illumination beams and the image data collection in accordance with an embodiment of the invention. The direction of motion 202 of the target wafer (or other substrate) is again shown.

The fifth arrangement per FIG. 6 is similar to the third arrangement per FIG. 4A. However, the shift or offset between the higher-energy beam area 606 and the lower-energy beam area 604 is greater in the arrangement of FIG. 6 than in the arrangement of FIG. 4A. In addition, the image data collection area 608 is within a more narrowly-defined area of overlap between the higher-energy beam area 606 and the lower-energy beam area 604.

As a result, the corresponding steady voltage level should be longer in the fifth arrangement than in the third arrangement (see steady level 435 in FIG. 4B). In addition, the first surface voltage ramp (during the more narrowly-defined dual-beam area) may not have sufficient time to reach a plateau voltage (see first ramp 436 and first plateau 438 in FIG. 4B). In that case, the image data collection 608 may occur during the first surface voltage ramp. Finally, the second surface voltage ramp (when illumination is only from the higher-energy beam) should be longer in the fifth arrangement than in the third arrangement (see second ramp 440 in FIG. 4B).

Figure 7A:
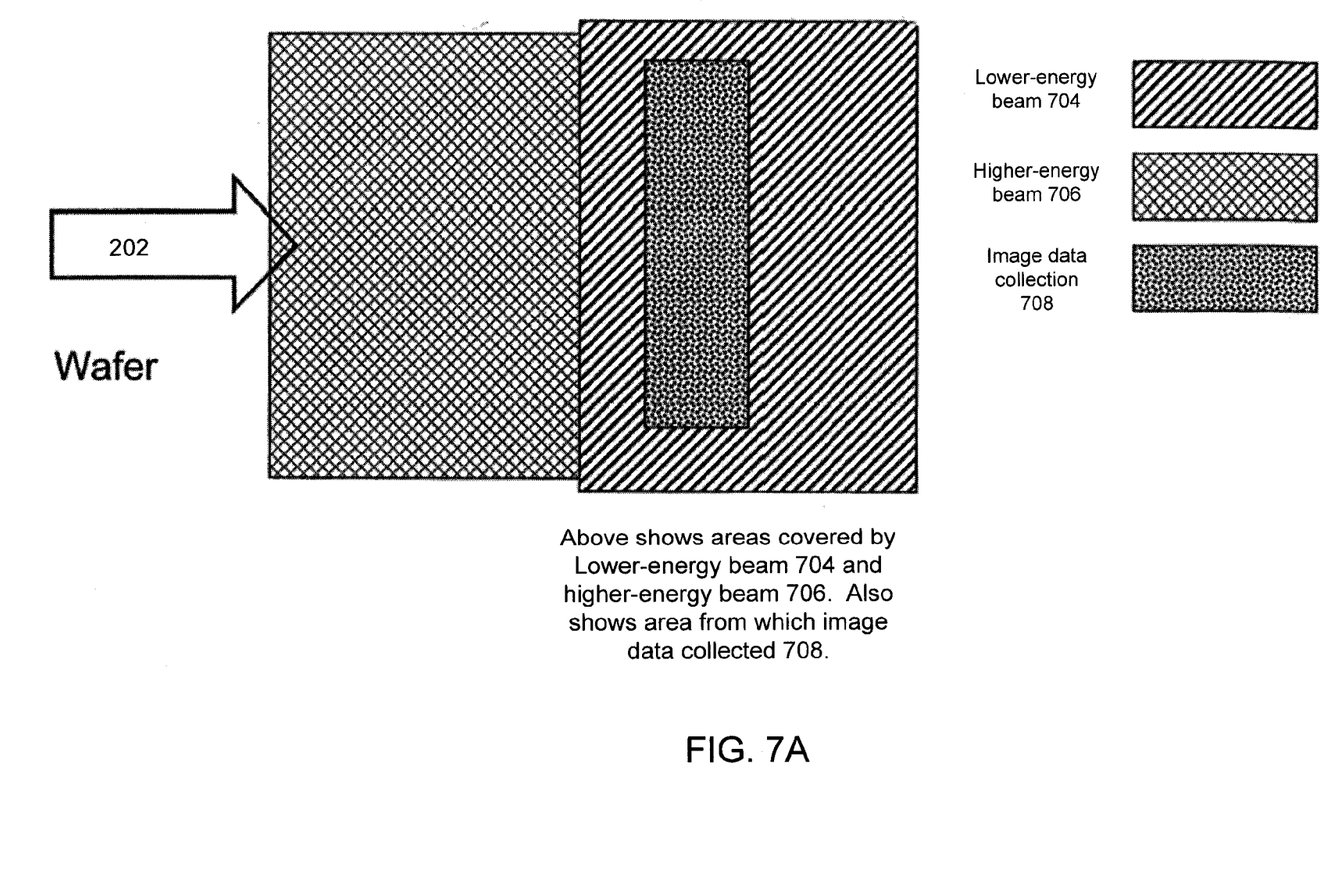
FIG. 7A is a schematic diagram showing a sixth arrangement of the dual illumination beams and the image data collection in accordance with an embodiment of the invention.

FIG. 7A is a schematic diagram showing a sixth arrangement of the dual illumination beams and the image data collection in accordance with an embodiment of the invention. The direction of motion 202 of the target wafer (or other substrate) is again shown.

Figure 7B:
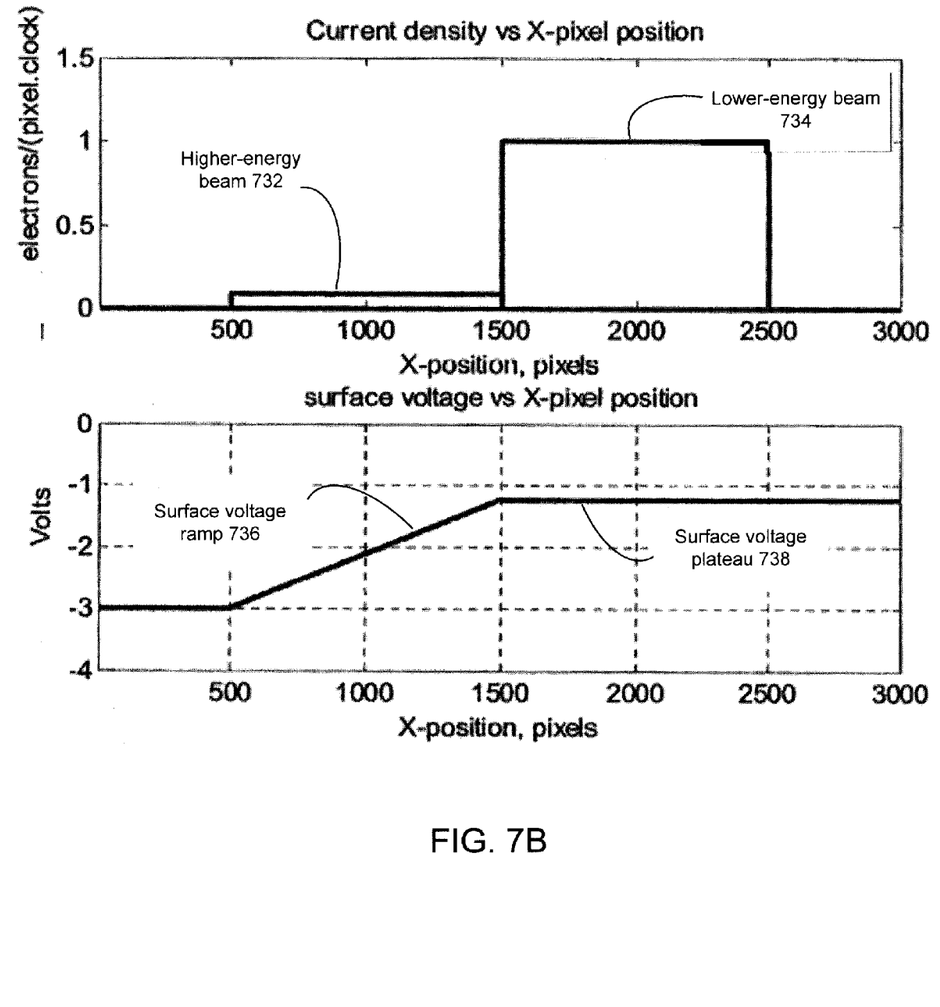
FIG. 7B shows graphs of beam current densities and surface voltage for the sixth arrangement in accordance with an embodiment of the invention.

FIG. 7B shows example graphs of beam current densities and surface voltage for the sixth arrangement in accordance with an embodiment of the invention. In the top portion of FIG. 7B, plots of electron current density versus x-pixel position are shown for the higher-energy beam (see plot 732) and for the lower-energy beam (see plot 734). As shown by the height of the plots, the higher-energy beam may have a lower current density than the lower-energy beam. In particular, the higher-energy beam 732 is shown to have approximately one-tenth the current density as the lower-energy beam 734. In the bottom portion of FIG. 7B, an example plot of surface voltage versus x-pixel position is shown.

In this sixth arrangement, the first deflector 105 is configured such that the lower-energy beam "illuminates" or covers a first rectangular area 704 whose boundaries are shown in FIG. 7A. (In this case, there is no overlap between the first rectangular area and the other areas shown.) The second deflector 117 is configured such that the higher-energy beam "illuminates" or covers a second rectangular area 706 shown in FIG. 7A. (Part of the first rectangular area is overlapped by the image data collection area 708 in the figure.)

In this arrangement, the areas illuminated by the lower-energy and higher-energy beams are adjacent but do not overlap. Instead, the second rectangular area (the higher-energy beam) 706 is shifted or offset in the opposite direction as the direction 202 of the substrate motion so that a target region is moved through the high-energy beam 706 and then the low-energy beam 704. Meanwhile, in accordance with this arrangement, the image data collection area 708 is positioned within the first rectangular area (the lower-energy beam) 704.

With this arrangement, a region of the target substrate to be imaged (i.e. a target region) is first moved under the areas illuminated the second rectangular area (the higher-energy beam) 706. As shown in FIG. 7B, the illumination by the second rectangular area (the higher-energy beam) 706 may be configured so as to increase or ramp up 736 the surface voltage of a target region of an insulating or semiconductor substrate.

As further shown in FIG. 7B, a surface voltage plateau 738 may occur when the target region transitions to the area covered by the first rectangular area (the lower-energy beam) 704. The image data collection 708 occurs during this voltage plateau. This voltage plateau may be stable and last even after the target region passes the first rectangular area (the lower-energy beam) 704. Thus, this arrangement also provides for surface potential stabilization before the target region is imaged (see the first voltage plateau 738) and also pre-charging of the defects of interest.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for generating a dual-energy electron beam, the apparatus comprising:
    a first electron beam source configured to generate a lower-energy electron beam;
    a second electron beam source configured to generate a higher-energy electron beam;
    a combining device for forming the dual-energy electron beam by combining the lower-energy and higher-energy electron beams;
    a first controllable electron-beam deflector configured to provide a controllable offset of a first area illuminated by the lower-energy electron beam in relation to an image data collection area;
    a second controllable electron-beam deflector configured to provide a controllable offset of a second area illuminated by the higher-energy electron beam in relation to the image data collection area;
    a moving stage holding a target substrate and moving the target substrate relative to the image data collection area; and
    a time delay integration detection system configured to obtain an electron image of an area even while the target substrate is moving relative to the image data collection area.

2. The apparatus of claim 1, wherein the combining device comprises a holey mirror that is biased to reflect the lower-energy electron beam and including an opening therein through which passes the higher-energy electron beam, the apparatus further comprising a prism array combiner configured to introduce a first dispersion between the lower-energy electron beam and the higher-energy electron beam within the dual-energy electron beam, and a prism array separator configured to separate the dual-energy electron beam traveling to a substrate from a scattered electron beam traveling away from the substrate, wherein the prism array separator is configured to introduce a second dispersion which compensates for the dispersion of the prism array combiner.

3. The apparatus of claim 1, wherein an electron current density of the higher-energy beam is one-half or less than an electron current density of the lower-energy beam.

4. The apparatus of claim 1, wherein a surface voltage of a target region is at a voltage plateau when the target region reaches the image collection area.

5. The apparatus of claim 4, wherein the first and second areas are approximately coincident, and wherein the image collection area is offset relative to a center of the first and second areas, further wherein the offset is in a direction of substrate motion.

6. The apparatus of claim 4, wherein the second area is offset relative to the first area in a direction opposite to a substrate motion, and wherein the image collection area overlaps both the first and second areas.

7. The apparatus of claim 6, wherein the image collection area overlaps with a center portion of the first area.

8. The apparatus of claim 4, wherein the first area is offset relative to the second area in a direction opposite to a substrate motion, and wherein the image collection area overlaps both the first and second areas.

9. The apparatus of claim 8, wherein the image collection area overlaps with a center portion of the second area.

10. The apparatus of claim 4, wherein the second area is offset relative to the first area in a direction opposite to a substrate motion, wherein the first and second areas have no overlap, and wherein the image collection area overlaps the first area.

11. A method for generating a dual-energy electron beam, the method comprising:
- generating a lower-energy electron beam;
- generating a higher-energy electron beam;
- reflecting the lower-energy electron beam by a holey mirror arrangement; and
- injecting the higher-energy electron beam through an opening in the holey mirror arrangement, thereby forming the dual-energy electron beam,
- using a first controllable electron-beam deflection to provide a controllable offset of a first area illuminated by the lower-energy electron beam in relation to an image data collection area; and
- using a second controllable electron-beam deflection to provide a controllable offset of a second area illuminated by the higher-energy electron beam in relation to the image data collection area; and
- translating a target substrate relative to the image data collection area using a moving stage; and
- obtaining an electron image of an area even while the target substrate is moving relative to the image data collection area by using a time delay integration detection system.

12. The method of claim 11, further comprising:
- using a magnetic prism array combiner to deflect the dual-energy electron beam in a way that introduces a first dispersion between the lower-energy electron beam and the higher-energy electron beam within the dual-energy electron beam; and
- using a magnetic prism array separator to defect the dual-energy electron beam in a way that introduces a second dispersion to compensate for the first dispersion.

13. The method of claim 11, wherein an electron current density of the higher-energy beam is one-half or less than an electron current density of the lower-energy beam.

14. The method of claim 11, wherein a surface voltage of a target region is at a voltage plateau when the target region reaches the image collection area.

15. The method of claim 14, wherein the first and second areas are approximately coincident, and wherein the image collection area is offset relative to a center of the first and second areas, further wherein the offset is in a direction of substrate motion.

16. The method of claim 14, wherein the second area is offset relative to the first area in a direction opposite to a substrate motion, and wherein the image collection area overlaps both the first and second areas.

17. The method of claim 16, wherein the image collection area overlaps with a center portion of the first area.

18. The method of claim 14, wherein the first area is offset relative to the second area in a direction opposite to a substrate motion, and wherein the image collection area overlaps both the first and second areas.

19. The method of claim 18, wherein the image collection area overlaps with a center portion of the second area.

20. The method of claim 14, wherein the second area is offset relative to the first area in a direction opposite to a substrate motion, wherein the first and second areas have no overlap, and wherein the image collection area overlaps the first area.

* * * * *